United States Patent
Tomekawa et al.

(10) Patent No.: US 10,840,280 B2
(45) Date of Patent: Nov. 17, 2020

(54) IMAGING DEVICE HAVING CAPACITOR SURROUNDING FIRST PHOTOELECTRIC CONVERTER IN PLAN VIEW

(71) Applicant: Panasonic Intellectual Property Management Co., Ltd., Osaka (JP)

(72) Inventors: Yuuko Tomekawa, Osaka (JP); Takahiro Koyanagi, Osaka (JP); Hiroyuki Amikawa, Kyoto (JP); Yasuyuki Endoh, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/279,157

(22) Filed: Feb. 19, 2019

(65) Prior Publication Data
US 2019/0288018 A1 Sep. 19, 2019

(30) Foreign Application Priority Data
Mar. 16, 2018 (JP) ................................ 2018-050135

(51) Int. Cl.
*H01L 27/146* (2006.01)
(52) U.S. Cl.
CPC .. *H01L 27/14605* (2013.01); *H01L 27/14607* (2013.01); *H01L 27/14609* (2013.01); *H01L 27/14627* (2013.01); *H01L 27/14636* (2013.01); *H01L 27/14641* (2013.01)

(58) Field of Classification Search
CPC ........ H01L 27/14605; H01L 27/14607; H01L 27/14609; H01L 27/14627; H01L 27/14636; H01L 27/14641
See application file for complete search history.

(56) References Cited

U.S. PATENT DOCUMENTS

| | | | |
|---|---|---|---|
| 2013/0240961 A1 | 9/2013 | Nakatsuka | |
| 2015/0054110 A1* | 2/2015 | Kashihara | ......... H01L 27/14636 257/435 |
| 2018/0308883 A1* | 10/2018 | Yanagita | ........... H01L 27/14629 |

FOREIGN PATENT DOCUMENTS

| | | |
|---|---|---|
| JP | 2012-199583 | 10/2012 |
| JP | 2013-140914 | 7/2013 |
| JP | 2013-207321 | 10/2013 |
| JP | 2017-017155 | 1/2017 |
| JP | 2017-084892 | 5/2017 |
| WO | 2017/130728 | 8/2017 |

* cited by examiner

*Primary Examiner* — Matthew E. Gordon
(74) *Attorney, Agent, or Firm* — McDermott Will & Emery LLP

(57) ABSTRACT

An imaging device includes: a semiconductor substrate; a first photoelectric converter which is disposed in the semiconductor substrate; a second photoelectric converter different from the first photoelectric converter, which is disposed in the semiconductor substrate; a wiring layer disposed on or above the semiconductor substrate; and a capacitor which is disposed in the wiring layer and surrounds the first photoelectric converter in plan view. The capacitor includes a first electrode, a second electrode, and a dielectric layer disposed between the first electrode and the second electrode. The first electrode is connected to one of the first photoelectric converter and the second photoelectric converter.

9 Claims, 10 Drawing Sheets

IMAGING DEVICE HAVING CAPACITOR SURROUNDING FIRST PHOTOELECTRIC CONVERTER IN PLAN VIEW

BACKGROUND

1. Technical Field

The present disclosure relates to an imaging device.

2. Description of the Related Art

There heretofore have been known solid-state imaging devices, of which complementary metal-oxide semiconductor (CMOS) image sensors are representative. For example, International Publication No. 2017/130728 and Japanese Unexamined Patent Application Publication No. 2012-199583 disclose a conventional image sensor. An image sensor has multiple pixels, with a photoelectric converter and a read circuit that reads out a signal charge generated by the photoelectric converter provided to each pixel.

SUMMARY

In one general aspect, the techniques disclosed here feature an imaging device including: a semiconductor substrate having a first principal surface, and a second principal surface on an opposite side of the first principal surface; a first photoelectric converter which is disposed in the semiconductor substrate and generates a first signal charge by converting first light incident to the first photoelectric converter; a second photoelectric converter different from the first photoelectric converter, which is disposed in the semiconductor substrate and generates a second signal charge by converting second light incident to the second photoelectric converter; a wiring layer disposed on or above the first principal surface; and a capacitor which is disposed in the wiring layer and surrounds the first photoelectric converter in plan view. The capacitor includes a first electrode, a second electrode, and a dielectric layer disposed between the first electrode and the second electrode. The first electrode is connected to one of the first photoelectric converter and the second photoelectric converter.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Overview of Present Disclosure

Figure 1:
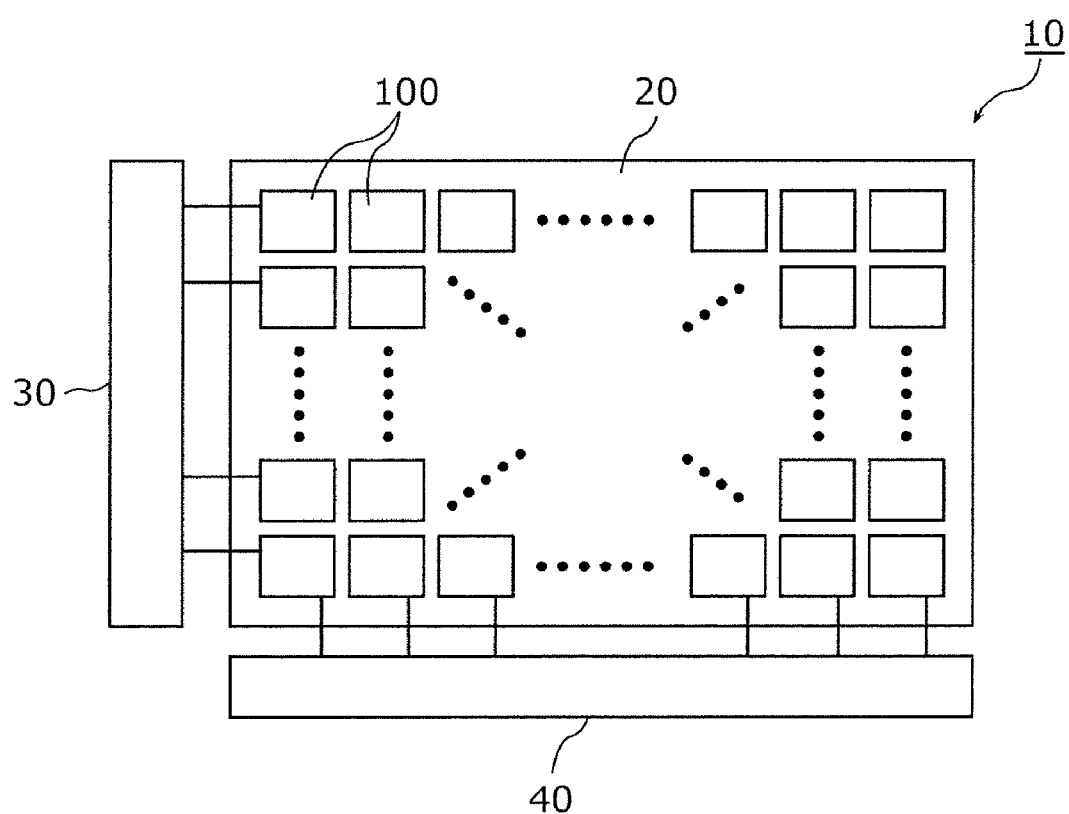
FIG. 1 is a plan view schematically illustrating the planar structure of an imaging device according to an embodiment.

The overview of an aspect of the present disclosure will be described before describing an embodiment of the present disclosure in detail. The overview of the aspect of the present disclosure is as follows.

An imaging device according to an aspect of the present disclosure includes: a semiconductor substrate having a first principal surface, and a second principal surface on an opposite side of the first principal surface; a first photoelectric converter which is disposed in the semiconductor substrate and generates a first signal charge by converting first light incident to the first photoelectric converter; a second photoelectric converter different from the first photoelectric converter, which is disposed in the semiconductor substrate and generates a second signal charge by converting second light incident to the second photoelectric converter; a wiring layer disposed on or above the first principal surface; and a capacitor which is disposed in the wiring layer and surrounds the first photoelectric converter in plan view. The capacitor includes a first electrode, a second electrode, and a dielectric layer disposed between the first electrode and the second electrode. The first electrode is connected to one of the first photoelectric converter and the second photoelectric converter.

If the capacitor is not provided encompassing the first photoelectric converter, the potential of the first photoelectric converter would change due to change in potential applied to wiring provided nearby the first photoelectric converter and parasitic capacity of the wiring. Change in potential of the first photoelectric converter would result in noise component being included in the generated signal charge.

In contrast with this, the capacitor is provided encompassing the first photoelectric converter in the imaging device according to the present aspect, so the electrode of the capacitor functions as an electrical shield. That is to say, change in potential of the first photoelectric converter can be suppressed, so noise can be reduced.

Also, the first electrode of the capacitor is connected to the first photoelectric converter or the second photoelectric converter, so the capacitor can store a charge generated at the first photoelectric converter or the second photoelectric converter. Accordingly, the saturation amount of the charge at the first photoelectric converter or the second photoelectric converter can be made larger as compared to a case where the capacitor is not connected to the first photoelectric converter or the second photoelectric converter. Thus, the critical intensity of light regarding which photoelectric conversion can be performed can be increased, so the dynamic range of the imaging device can be expanded.

In this way, according to the imaging device of the present aspect, both noise reduction and expansion of dynamic range can be realized.

Also, for example, the imaging device according to an aspect of the present disclosure may further include a charge storage region that stores a signal charge generated by the one of the first photoelectric converter and the second photoelectric converter. The first electrode may be disposed between the semiconductor substrate and the second electrode, and the second electrode may cover the charge storage region.

Accordingly, the second electrode of the capacitor covers the charge storage region, so change in potential of the charge storage region can be suppressed. Thus, the second electrode functions as an electrical shield regarding the charge storage region, so wiring can be provided directly above the charge storage region, for example. That is to say, limited pixel area can be efficiently used, since the charge storage region and wiring can be provided overlapping in plan view.

Also, an area of the first photoelectric converter and an area of the second photoelectric converter may differ in plan view, and the first electrode may be connected to one of the first photoelectric converter and the second photoelectric converter, of which the area is smaller.

That is to say, both noise reduction and expansion of dynamic range can be realized. For example, a single unit cell can be made up of two photoelectric converters that have different areas. In this case, the sensitivity of the imaging device can be switched by switching readout of the two photoelectric converters. At the photoelectric converter of which the area is large, for example, photoelectric conversion of weak light can be performed while suppressing effects of noise. Thus, the sensitivity of the imaging device can be improved by using the photoelectric converter of which the area is large. Also, at the photoelectric converter of which the area is small, photoelectric conversion of strong light can be performed without saturation of charge. Accordingly, the sensitivity of the imaging device can be reduced by using the photoelectric converter of which the area is small.

Also, for example, the area of the first photoelectric converter may be larger than the area of the second photoelectric converter.

Also, for example, the semiconductor substrate is configured to cause the first light and the second light to enter the semiconductor substrate from the second principal surface.

Also, for example, the imaging device according to an aspect of the present disclosure may further include a wiring for applying a constant potential to the second electrode.

Accordingly, the second electrode is maintained at the constant potential, thereby enabling change in the charge stored in the capacitor to be suppressed, so noise can be reduced.

Also, for example, the imaging device according to an aspect of the present disclosure may further include a transistor, with the first electrode connected to the one of the first photoelectric converter and the second photoelectric converter via the transistor.

Accordingly, conduction and non-conduction between the first photoelectric converter or second photoelectric converter and the capacitor can be switched by switching the transistor on and off. For example, the saturation amount of the charge can be increased by the transistor going on so that the first photoelectric converter or second photoelectric converter and the capacitor conduct. Also, the saturation amount of the charge can be decreased by the transistor going off so that the first photoelectric converter or second photoelectric converter and the capacitor do not conduct. Thus, the saturation amount of the charge can be switched by controlling the transistor on and off, so the dynamic range of the imaging device can be switched.

Also, for example, the second electrode may continuously surround the first photoelectric converter.

In the present disclosure, all or a part of any of circuit, unit, device, part or portion, or any of functional blocks in the block diagrams may be implemented as one or more of electronic circuits including, but not limited to, a semiconductor device, a semiconductor integrated circuit (IC) or LSI (large scale integration). The LSI or IC can be integrated into one chip, or also can be a combination of plural chips. For example, functional blocks other than memory may be integrated into one chip. The name used here is LSI or IC, but it may also be called system LSI, very large scale integration (VLSI), or ultra large scale integration (ULSI) depending on the degree of integration. A field programmable gate array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the circuit, unit, device, part or portion are implemented by executing software. In such a case, the software is recorded on one or more non-transitory recording media such as read only memory (ROM), an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

The following is a specific description of an embodiment with reference to the drawings. Note that the embodiment described below is a general or specific example. Accordingly, values, shapes, materials, components, placements and connected states of components, steps, the order of steps, and so forth illustrated in the following embodiment, are only exemplary, and do not restrict the present disclosure. Components in the following embodiments which are not included in an independent Claim indicating a highest order concept are described as optionally included components.

The drawings are schematic diagrams, and are not necessarily precise illustrations. Accordingly, the drawings are not necessarily drawn to scale, for example. Components which are substantially of the same configuration are denoted by the same reference symbols in the drawings, and redundant description will be omitted or simplified.

Note that in the present specification, terms indicating relations between elements, such as "perpendicular", terms indicating shapes of elements, such as "square", "rectangular", and so forth, and numerical ranges, are not expression strictly restricted to the meanings thereof, but rather are expressions meaning a substantially equivalent range, including differences of several percent or so, for example.

Also, in the present specification, the terms "above" and "below" do not indicate the upper direction (vertically above) and lower direction (vertically below) in an absolute spatial recognition, and instead are used as terms stipulating a relative positional relation based on the order of layering in a layered configuration. Further, the terms "above" and "below" is applied not only to cases where two components are disposed with a spacing therebetween and a separate component is present between the two components, but also to cases where two components are disposed in contact with each other.

Moreover, in the present specification, "thickness direction" means the direction of thickness of the semiconductor substrate of the imaging device, which is a direction perpendicular to the principal surface of the semiconductor substrate, and "plan view" means a view taken from a direction perpendicular to the principal surface of the semiconductor substrate.

Embodiment

Configuration

First, the configuration of an imaging device according to an embodiment will be described with reference to FIG. 1. FIG. 1 is a plan view schematically illustrating the planar structure of an imaging device 10 according to the present embodiment. The imaging device 10 includes a pixel portion 20, a vertical scanning circuit 30, and a horizontal scanning circuit 40, as illustrated in FIG. 1. The imaging device 10 is a front-illuminated CMOS image sensor in the present embodiment.

The pixel portion 20 has multiple unit cells 100 two-dimensionally arrayed, as illustrated in FIG. 1. Specifically, the multiple unit cells 100 are laid out in a matrix form. Note that the multiple unit cells 100 may be laid out one-dimensionally, i.e., linearly.

Each of the multiple unit cells 100 has a photoelectric converter that performs photoelectric conversion of incident light to generate a signal charge. The amount of the generated signal charge (hereafter referred to as "charge amount") is dependent on the intensity of incident light. Specifically, the greater the intensity of the incident light is, the greater the value of the charge amount is, and the smaller the light intensity is, the smaller the value is.

Figure 2:
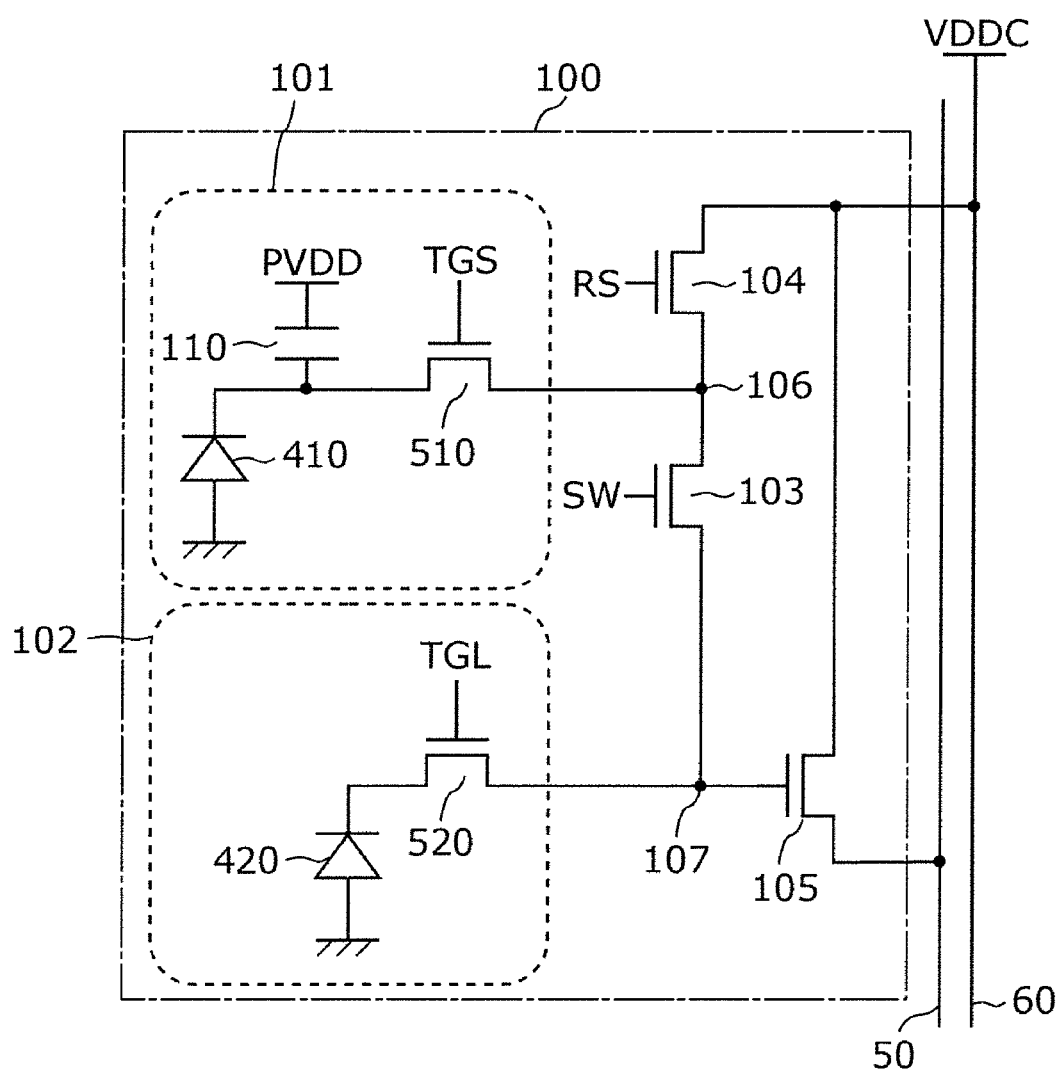
FIG. 2 is a diagram illustrating a circuit configuration of a unit cell of the imaging device according to the embodiment.

A unit cell 100 has a low-sensitivity pixel 101 and a high-sensitivity pixel 102, as illustrated in FIG. 2. FIG. 2 is a circuit configuration diagram of the unit cell 100 of the imaging device 10 according to the present embodiment. The range over which the unit cell 100 is capable of photoelectric conversion, i.e., the dynamic range, can be broadened by switching pixels to be read between the low-sensitivity pixel 101 and high-sensitivity pixel 102.

The pixel portion 20 is provided with a control line connected to the vertical scanning circuit 30 for each row of the multiple unit cells 100. Specifically, the pixel portion 20 is provided with a reset control line RS, selection control line SW, first transfer control line TGS, and second transfer control line TGL, for each row of the multiple unit cells 100, as illustrated in FIG. 2.

The pixel portion 20 is also provided with a signal line connected to the horizontal scanning circuit 40 for each column of the multiple unit cells 100. Specifically, a vertical signal line 50 is provided for each column of the multiple unit cells 100, as illustrated in FIG. 2. A power source line 60 is provided connected to each unit cell 100. Details such as configurations and functions, and so forth of the unit cell 100, control lines, and signals lines, will be described later.

The vertical scanning circuit 30 is one of peripheral circuits provided on the periphery of the pixel portion 20. The peripheral circuits are circuits for controlling readout of charges generated by the multiple photoelectric converters. The vertical scanning circuit 30 controls potential to be supplied to control lines and so forth, for selecting the unit cell 100 to be the object of reading out signal charges. Specifically, the vertical scanning circuit 30 controls potential supplied to the reset control lines RS, selection control lines SW, first transfer control lines TGS, and second transfer control lines TGL.

The horizontal scanning circuit 40 is one of peripheral circuits provided on the periphery of the pixel portion 20. The horizontal scanning circuit 40 processes signal charges transferred from each unit cell 100 via the vertical signal lines 50 provided to each of the columns. An output signal line (omitted from illustration) is connected to the horizontal scanning circuit 40, over which the signal charges transferred from each of the multiple unit cells 100 are sequentially output.

Next, the detailed configuration of the multiple unit cells 100 will be described. First, the circuit configuration of the multiple unit cells 100 will be described with reference to FIG. 2. Note that in the present embodiment, the multiple unit cells 100 have the same circuit configuration as each other.

The unit cell 100 has a low-sensitivity pixel 101 and high-sensitivity pixel 102, as described above. The unit cell 100 further has a switch transistor 103, a reset transistor 104, and an amplifying transistor 105, as illustrated in FIG. 2.

The low-sensitivity pixel 101 has a photodiode 410, a capacitor 110, and a transfer transistor 510.

The photodiode 410 is one of multiple photoelectric converters that the imaging device 10 has. The anode of the photodiode 410 is grounded, and the cathode is connected to a first electrode of the capacitor 110 that is one of two electrodes thereof. Note that the first electrode specifically is a lower electrode 111 illustrated in FIGS. 4 and 5.

The capacitor 110 is provided to store the signal charge generated at the photodiode 410. The signal charge generated at the photodiode 410 is stored in the capacitor 110, so the saturation amount of the photodiode 410 can be increased. Accordingly, the dynamic range of the low-sensitivity pixel 101 can be expanded.

A second electrode of the capacitor 110 that is the other of the two electrodes is connected to a predetermined wiring. The wiring to which the second electrode is connected is maintained at a constant potential PVDD, for example. That is to say, the second electrode also is maintained at the constant potential PVDD. Note that the second electrode specifically is an upper electrode 112 illustrated in FIGS. 4 and 5.

At this time, the constant potential PVDD may vary over time. That is to say, it is sufficient for the constant potential PVDD to be at a constant potential among multiple unit cells 100 at a certain optional timing. The second electrode may be grounded.

The transfer transistor 510 is a switching device to switch conduction/non-conduction between the first electrode of the capacitor 110 and a first floating diffusion (FD) portion 106. One of the drain and source of the transfer transistor 510 is connected to the cathode of the photodiode 410 and the first electrode of the capacitor 110. The other of the drain and source of the transfer transistor 510 is connected to the first FD portion 106. The gate of the transfer transistor 510 is connected to the first transfer control line TGS.

Predetermined potential is supplied by the vertical scanning circuit 30 to the first transfer control line TGS. In a case where predetermined potential is supplied to the first transfer control line TGS, the transfer transistor 510 goes on, i.e., is in a conducting state. The first electrode of the capacitor 110 and the first FD portion 106 are in a conducting state due to the transfer transistor 510 going on.

According to this configuration, a signal charge generated by the photodiode 410 performing photoelectric conversion of incident light is stored in the capacitor 110 in the low-sensitivity pixel 101. By the transfer transistor 510 transitioning to a conducting state, the signal charge stored in the capacitor 110 is in a readable state.

The high-sensitivity pixel 102 has a photodiode 420 and a transfer transistor 520.

Figure 3:
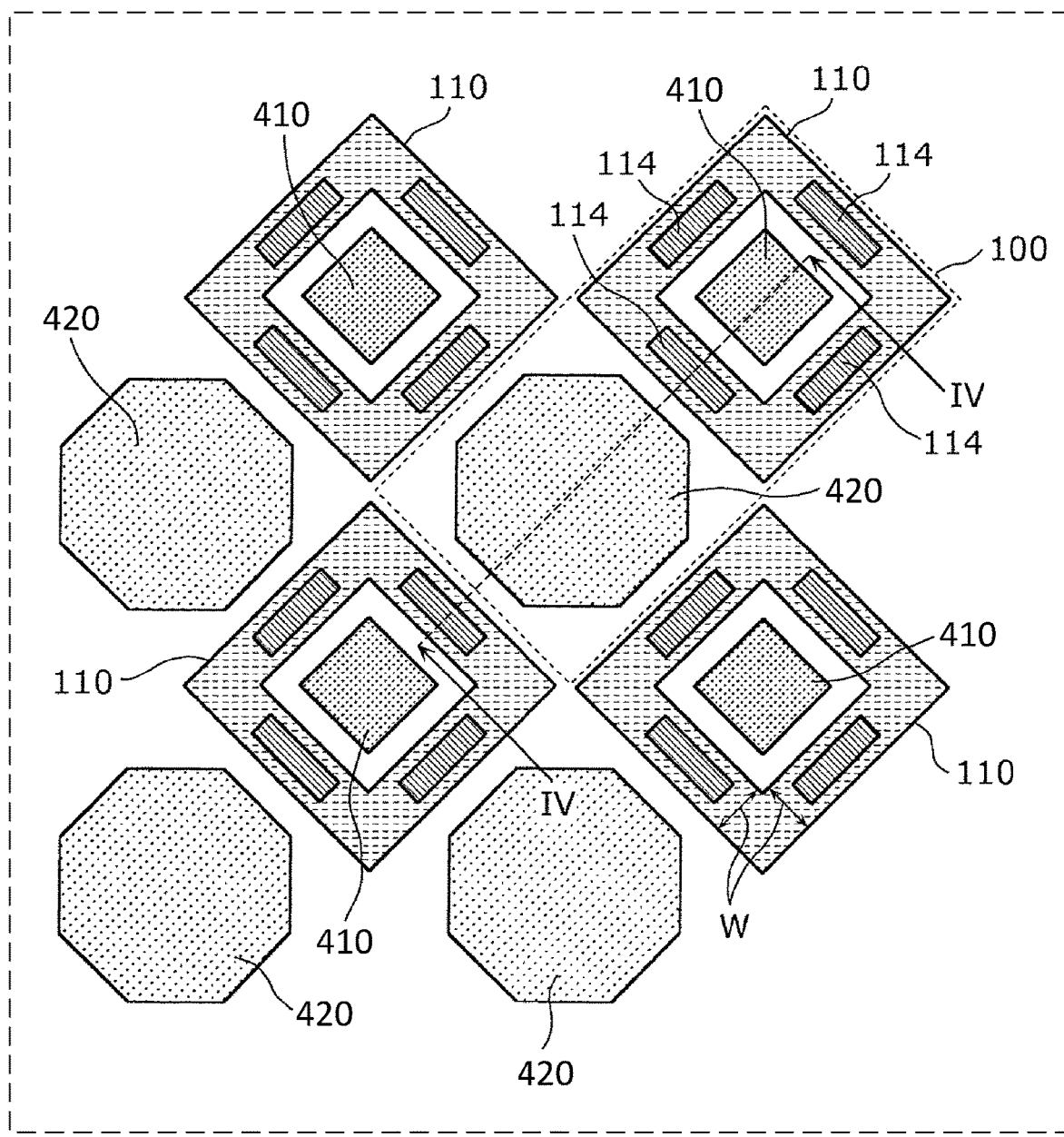
FIG. 3 is a diagram illustrating a planar layout of multiple unit cells of the imaging device according to the embodiment.

The photodiode 420 is one of multiple photoelectric converters that the imaging device 10 has. The anode of the photodiode 420 is grounded, and the cathode is connected to one of the drain and source of the transfer transistor 520. The photodiode 420 is configured to have a larger light-receiving area than the photodiode 410 contained in the low-sensitivity pixel 101. Specifically, the photodiode 420 has a larger area than the photodiode 410 in plan view, as illustrated in FIG. 3.

The transfer transistor 520 is a switching device to switch conduction/non-conduction between the photodiode 420 and a second FD portion 107. One of the drain and source of the transfer transistor 520 is connected to the cathode of the photodiode 420. The other of the drain and source of the transfer transistor 520 is connected to the second FD portion 107. The gate of the transfer transistor 520 is connected to the second transfer control line TGL.

Predetermined potential is supplied by the vertical scanning circuit 30 to the second transfer control line TGL. In a case where predetermined potential is supplied to the second transfer control line TGL, the transfer transistor 520 goes on, i.e., is in a conducting state. The cathode of the photodiode 420 and the second FD portion 107 are in a conducting state due to the transfer transistor 520 going on.

According to this configuration, a signal charge is generated by the photodiode 420 performing photoelectric conversion of incident light in the high-sensitivity pixel 102. By the transfer transistor 520 transitioning to a conducting state, the signal charge generated by the photodiode 420 is in a readable state.

The switch transistor 103 is a switching device to switch conduction/non-conduction between the first FD portion 106 and the second FD portion 107. One of the drain and source of the switch transistor 103 is connected to the first FD portion 106, and the other of the drain and source is connected to the second FD portion 107. The gate of the switch transistor 103 is connected to the selection control line SW.

The reset transistor 104 is a switching device to switch conduction/non-conduction between the first FD portion 106 and power source line 60. The reset transistor 104 is provided to reset charges stored in the first FD portion 106 and second FD portion 107. One of the drain and source of the reset transistor 104 is connected to the power source line 60, and the other of the drain and source is connected to the first FD portion 106. The gate of the reset transistor 104 is connected to the reset control line RS.

The amplifying transistor 105, along with a constant-current source that is omitted from illustration, make up a source follower circuit. Specifically, the amplifying transistor 105 converts gate potential into voltage, and outputs to the vertical signal line 50. One of the drain and source of the amplifying transistor 105 is connected to the power source line 60, and the other of the drain and source is connected to the vertical signal line 50. The gate of the amplifying transistor 105 is connected to the second FD portion 107.

Figure 4:
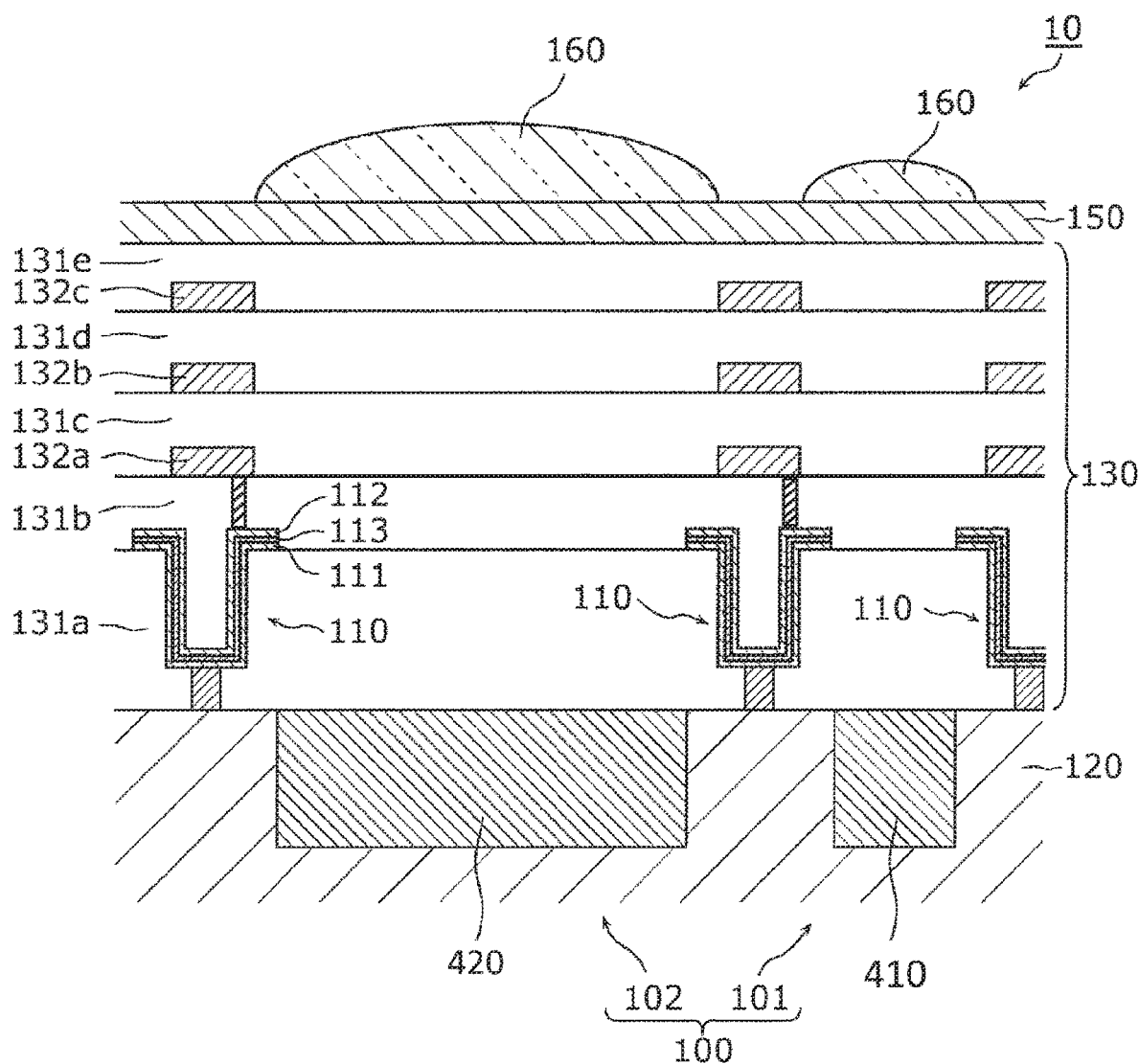
FIG. 4 is a cross-sectional view of a unit cell of the imaging device according to the embodiment.

The first FD portion 106 is a floating diffusion layer formed within a semiconductor substrate 120 (see FIG. 4). The first FD portion 106 stores signal charges generated at the low-sensitivity pixel 101.

The second FD portion 107 is a floating diffusion layer formed within the semiconductor substrate 120 (see FIG. 4). The second FD portion 107 stores signal charges generated at the high-sensitivity pixel 102. In a case where the switch transistor 103 goes on, the second FD portion 107 can also store signal charges generated at the low-sensitivity pixel 101.

In the present embodiment, the transfer transistors 510 and 520, the switch transistor 103, the reset transistor 104, and the amplifying transistor 105, are each a metal-oxide-semiconductor field-effect transistor (MOSFET). Alternatively, the transistors may each be a thin-film transistor (TFT).

For example, the transistors are each an n-type MOSFET. Each transistor goes on in a case where the potential supplied to the gate thereof goes to high level, i.e., the transistor transitions to a conducting state. Each transistor goes off in a case where the potential supplied to the gate thereof goes to low level, i.e., the transistor transitions to a non-conducting state. Note that the transistors each may be a p-type MOSFET. In this case, the relation between potential level supplied to the gate of each transistor and the on/off of the transistor is the opposite of the case of an n-type MOSFET. Note that n-type MOSFETs and p-type MOSFETs may coexist among the transistors.

Now, processing of reading out signal charges from the unit cell 100 will be described. In the present embodiment, signal charges can be read out as voltage signals with the low-sensitivity pixel 101 and high-sensitivity pixel 102 being switched. Specifically, a voltage signal is output from the unit cell 100 to the vertical signal line 50 by the vertical scanning circuit 30 adjusting the potential to be supplied to the control lines connected to the unit cell 100 that is the object of readout.

First, operations in a case of reading out a signal charge from the low-sensitivity pixel 101 will be described. First, a resetting operation, which is processing to reset the charge stored in the first FD portion 106 and second FD portion 107, is performed. Specifically, the switch transistor 103 and reset transistor 104 are placed in a conducting state by the vertical scanning circuit 30 supplying high level potential to each of the selection control line SW and reset control line RS. This causes the first FD portion 106 and second FD portion 107 to conduct with the power source line 60, so the potentials of the first FD portion 106 and second FD portion 107 are reset to the potential of power source voltage VDDC.

After the resetting operation, the photodiode 410 and photodiode 420 are exposed. The signal charge generated at the photodiode 410 by the exposing is stored in the capacitor 110.

Note that the resetting operation may be performed at the same time as exposing of the photodiodes 410 and 420. During the resetting operation, both the transfer transistors 510 and 520 are maintained in a non-conducting state. Specifically, during the resetting operation, the vertical scanning circuit 30 supplies low level potential to the first transfer control line TGS and second transfer control line TGL.

Next, after the reset transistor 104 is transitioned to a non-conducting state, the transfer transistor 510 and switch transistor 103 transition to a conducting state. Specifically, the vertical scanning circuit 30 supplies low level potential to the reset control line RS, and thereafter supplies high level potential to the first transfer control line TGS and selection control line SW. At this time, low level potential is being supplied to the second transfer control line TGL, and the transfer transistor 520 is in a non-conducting state.

Accordingly, the signal charge generated at the photodiode 410 and stored in the capacitor 110 is transferred to the first FD portion 106 and second FD portion 107. The potentials of the first FD portion 106 and second FD portion 107 change in accordance with the charge amount transferred thereto. The first FD portion 106 and second FD portion 107 are connected to the gate of the amplifying transistor 105, so the amount of change of potential of the first FD portion 106 and second FD portion 107, i.e., the amount of signal charge generated at the photodiode 410, is converted into voltage and output to the vertical signal line 50.

Next, operations in a case of reading out a signal charge from the high-sensitivity pixel 102 will be described. First, the resetting operation is performed in the same way as in the case of the low-sensitivity pixel 101, and the photodiode 410 and photodiode 420 are exposed. The resetting operation may be performed at the same time as exposing.

Next, after having transitioned the switch transistor 103 to a non-conducting state, the transfer transistor 520 is transitioned to a conducting state. Specifically, the vertical scanning circuit 30 supplies low level potential to the selection control line SW, and thereafter supplies high level potential to the second transfer control line TGL. At this time, the first transfer control line TGS and reset control line RS are both supplied with low level potential, and the transfer transistor 510 and reset transistor 104 are in a non-conducting state.

Accordingly, the signal charge generated at the photodiode 420 is transferred to the second FD portion 107. The potential of the second FD portion 107 changes in accordance with the amount of charge transferred thereto. The second FD portion 107 is connected to the gate of the amplifying transistor 105, so the amount of change of potential at the second FD portion 107, i.e., the amount of signal charge generated at the photodiode 420, is converted to voltage and output to the vertical signal line 50.

As described above, in the imaging device 10 according to the present embodiment, each unit cell 100 has the low-sensitivity pixel 101 and high-sensitivity pixel 102, so images can be generated in both environments of low illumination and high illumination. For example, in low-illumination environment, such as night time or indoors, where there is not sufficient illumination, signal charges are read out from the high-sensitivity pixels 102, thereby generating high-quality images. In a high-illumination environment under the midday sun, signal charges are read out from the low-sensitivity pixels 101, thereby generating high-quality images.

Also, in a case where a shooting range includes high-illumination and low-illumination regions, an image generated based on signals charges from the low-sensitivity pixels 101 and an image generated based on signals charges from the high-sensitivity pixels 102 may be composited. Thus, high-quality images can be generated where loss of detail due to overexposure or underexposure is suppressed.

Next, the planar layout and cross-sectional structure of the unit cell 100 will be described with reference to FIGS. 3 through 5. FIG. 3 is a planar layout diagram of multiple unit cells 100 of the imaging device 10 according to the present embodiment. Note that FIG. 3 is intended to represent the positional relation of the photodiodes 410 and 420 and the capacitors 110, and the shapes thereof in plan view, so other components of the imaging device 10 are not illustrated. The photodiodes 410 and 420 and the capacitors 110 are hatched in this illustration, to facilitate viewing.

FIG. 4 is a cross-sectional view of unit cells 100 of the imaging device 10 according to the present embodiment. Specifically, FIG. 4 illustrates a cross-section taken along line IV-IV in FIG. 3. FIG. 5 is an enlarged cross-sectional view of principal portions, where a capacitor 110 in the imaging device 10 according to the present embodiment and the periphery thereof are illustrated in an enlarged manner. Note that in FIGS. 4 and 5, hatching to indicate a cross-section is not applied to inter-layer insulating layers 131a, 131b, 131c, 131d, and 131e of a wiring layer 130, to facilitate viewing. The same is true for later-described FIGS. 6 and 7.

The imaging device 10 has the semiconductor substrate 120 and the wiring layer 130, as illustrated in FIG. 4. The multiple unit cells 100 of the imaging device 10 are formed within the semiconductor substrate 120 and wiring layer 130. The imaging device 10 further has a planarization film 150 and microlenses 160. A color filter may be provided between the wiring layer 130 and planarization film 150.

An example of the semiconductor substrate 120 is a silicon substrate. Formed in the semiconductor substrate 120 are p-type or n-type well regions, and regions where dopants have been injected such as insulating element separation regions or the like, which are not illustrated in detail. Dopant injection is performed by, for example, ion injection or the like. Regions where the dopant has been injected are used as, for example, the photodiodes 410 and 420, first FD portion 106 and second FD portion 107, sources and drains of the transistors, and so forth. Gates of the transistors are realized by electroconductive metal electrodes (omitted from illustration) formed on the light input side face of the semiconductor substrate 120, with a thin-film gate insulating film interposed therebetween.

The wiring layer 130 is provided on the light input side face of the semiconductor substrate 120. According to the present embodiment, the wiring layer 130 has a multi-layer wiring structure, including multiple inter-layer insulating layers 131a, 131b, 131c, 131d, and 131e, and multiple wirings 132a, 132b, and 132c, as illustrated in FIG. 4.

The inter-layer insulating layers 131a, 131b, 131c, 131d, and 131e are each insulating layers that have translucency. For example, the inter-layer insulating layers 131a, 131b, 131c, 131d, and 131e are formed using silicon oxide ($SiO_x$) or silicon nitride (SiN) or the like. The inter-layer insulating layers 131a, 131b, 131c, 131d, and 131e are formed by, for example forming a film of insulating material by metalorganic chemical vapor deposition (MOCVD), and patterning by photolithography and etching or the like as necessary.

Figure 5:
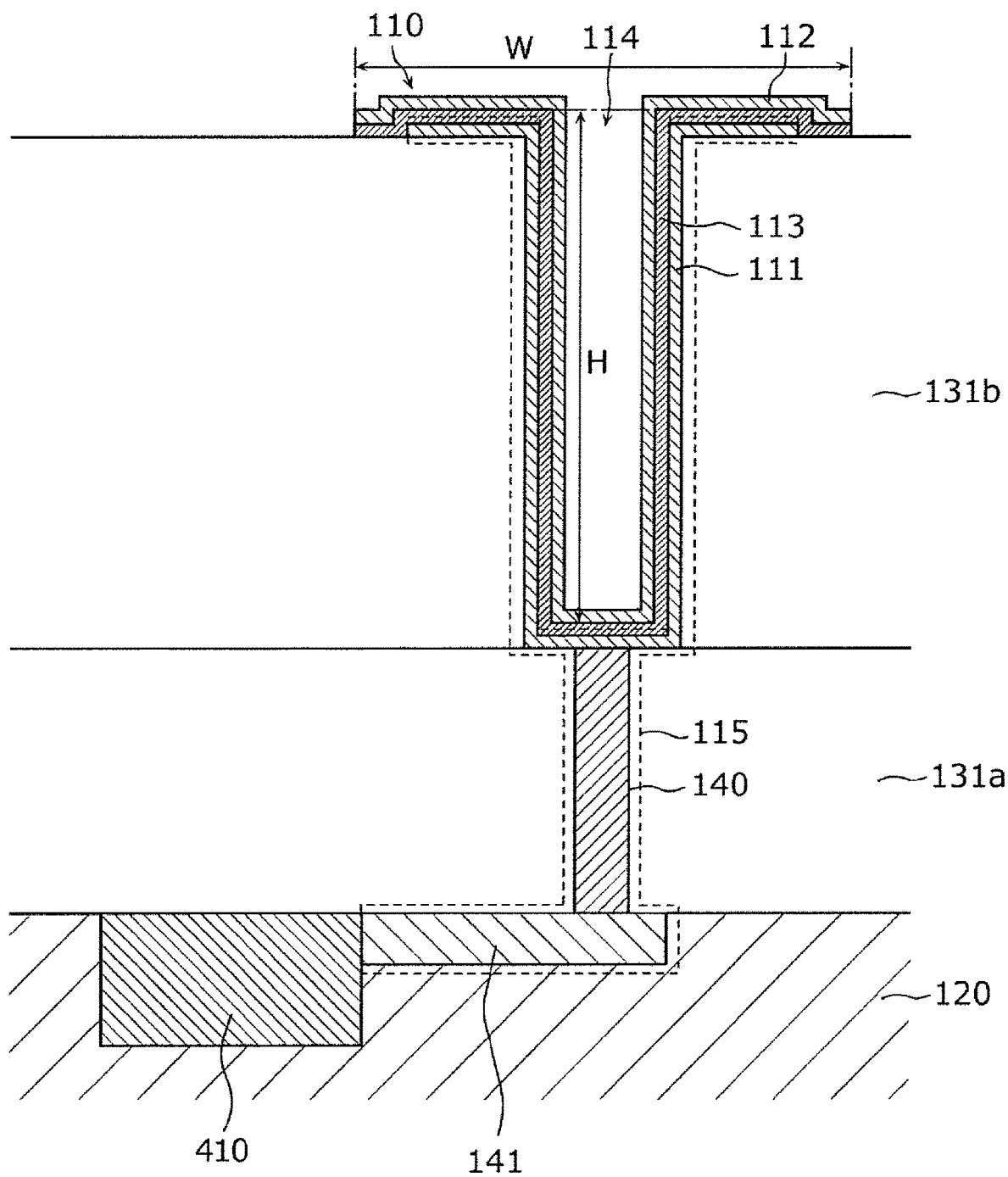
FIG. 5 is a cross-sectional view where a capacitor of the imaging device according to the embodiment and the periphery thereof are enlarged in view.

The capacitors 110 formed in the wiring layer 130 have trench structures in the present embodiment, as illustrated in FIGS. 4 and 5. Accordingly, the inter-layer insulating layer 131a is formed by forming an insulating film such as a silicon oxide film or the like on the surface of the semiconductor substrate 120, and thereafter forming trenches for the capacitors 110 and through holes for contact plugs 140 by patterning.

The wirings 132a, 132b, and 132c are for the control lines, vertical signal lines, and so forth, provided to the pixel portion 20. The wirings 132a, 132b, and 132c are formed using metal material such as copper (Cu), aluminum (Al), or the like, for example. The wirings 132a, 132b, and 132c are formed by film formation of an electroconductive material by vapor deposition or the like, and patterning by photolithography and etching or the like.

The wiring layer 130 is formed by repeating formation of insulating films and forming and patterning electroconductive films. The thickness of the wiring layer 130 is 2 μm or the like for example, but is not restricted to this.

The planarization film 150 is formed using an inorganic material or organic material having translucency, for example. The planarization film 150 planarizes the face at the light input side, where the microlenses 160 are disposed.

The microlenses 160 are formed using a glass or resin material having translucency. The microlenses 160 are provided in a matrix, corresponding to the photodiodes 410 and photodiodes 420 in a one-on-one manner. The microlenses 160 are configured to guide incident light to the corresponding photodiodes 410 or 420.

The photodiodes 410 and 420 respectively are examples of the first photoelectric converter and second photoelectric converter formed in the semiconductor substrate 120, as illustrated in FIG. 4. Specifically, the photodiodes 410 and 420 have a p-type pinning region provided at the superficial portion on the upper face of the semiconductor substrate 120, and an n-type diffusion region provided in contact with this pinning region and at an underlying portion of the pinning region.

The photodiodes 410 and 420 are laid out alternatingly one each in a matrix form, as illustrated in FIG. 3. The photodiodes 410 are each provided encompassed by a capacitor 110 in planar view. For example, each photodiode 410 has the entire perimeter thereof encompassed by a capacitor 110, for example.

Each photodiode 420 is not encompassed by a single capacitor 110 in planar view, but is surrounded by four capacitors 110. Part of a capacitor 110 exists between a photodiode 410 and a photodiode 420 in plan view. Accordingly, the capacitor 110 functions as an electrical shield between the photodiode 410 and photodiode 420. Thus, the potential of the photodiode 410 can be suppressed from affecting the potential of the photodiode 420.

The photodiode 410 is connected to the lower electrode 111 of the capacitor 110, as illustrated in FIG. 5. Specifically, the photodiode 410 is connected to the lower electrode 111 via the contact plug 140 and a diffusion region 141. Thus, according to the present embodiment, the photodiode provided encompassed by a single capacitor 110, and the photodiode connected to the lower electrode 111 of the capacitor 110, are the same photodiode 410.

The area of the photodiode 420 in plan view is larger than that of the photodiode 410. That is to say, out of the first photoelectric converter and second photoelectric converter that the imaging device 10 has, the photodiode 410 is an example of the photoelectric converter that has a smaller area in plan view. Out of the first photoelectric converter and second photoelectric converter that the imaging device 10 has, the photodiode 420 is an example of the photoelectric converter that has a larger area in plan view. The lower electrode 111 of the capacitor 110 is connected to the photodiode 410 that has the smaller area in the present embodiment, as described above.

Accordingly, the light-receiving area of the photodiode 420 is larger than the light-receiving area of the photodiode 410, so the photodiode 420 can input a greater amount of light as compared to the photodiode 410 even in low-illumination environments, and perform photoelectric conversion. The area of the photodiode 420 is twice or more the area of the photodiode 410, for example, but is not restricted to this.

The shape of the photodiodes 410 in plan view is square as illustrated in FIG. 3 for example, but alternatively may be a rectangle, hexagon, octagon, or another polygon, or may be circular. The shape of the photodiodes 420 in plan view is an octagon for example, but alternatively may be a square, rectangle, hexagon, or another polygon, or may be circular. The shapes of the photodiodes 410 and 420 in plan view may be the same as each other.

The capacitors 110 are provided within the wiring layer 130 in the present embodiment. The capacitors 110 have a metal-insulator-metal (MIM) structure. A MIM structure is a structure where a dielectric layer is interposed between two electrodes that include metal. Specifically, the capacitors 110 have the lower electrode 111, the upper electrode 112, and a dielectric layer 113, as illustrated in FIGS. 4 and 5.

The capacitor 110 is provided encompassing one of the multiple photodiodes that the imaging device 10 has, in plan view. In the present embodiment, the capacitor 110 encompasses the photodiode 410 of the low-sensitivity pixel 101 in plan view, as illustrated in FIG. 3. The photodiode 410 is situated at the middle of the ring-shaped capacitor 110. The outer circumference of the photodiode 410, and the inner circumference and outer circumference of the ring-shaped capacitor 110, are formed concentrically, for example.

Specifically, each of the lower electrode 111, upper electrode 112, and dielectric layer 113 encompass the photodiode 410 in plan view. The plan view shape of the lower electrode 111, upper electrode 112, and dielectric layer 113 is a rectangular ring shape. The line width W of the lower electrode 111, upper electrode 112, and dielectric layer 113 is 320 nm for example, but is not restricted to this.

The lower electrode 111 is one example of the first electrode of the capacitor 110. The lower electrode 111 is, out of the two electrodes that the capacitor 110 has, the electrode closer to the semiconductor substrate 120, as illustrated in FIG. 4. That is to say, the lower electrode 111 is provided between the semiconductor substrate 120 and the upper electrode 112.

In the present embodiment, the lower electrode 111 is connected to the photodiode 410, as illustrated in FIG. 5. Specifically, the lower electrode 111 is connected to the photodiode 410 via the contact plug 140 and diffusion region 141. The lower electrode 111 and the cathode of the photodiode 410 have substantially the same potential.

The lower electrode 111 is formed using an electroconductive material such as a metal, metal compound, or the like. Used for the electroconductive material is an elemental metal such as titanium (Ti), aluminum (Al), gold (Au), platinum (Pt) or the like, or an alloy of two or more of these. Alternatively, an electroconductive metal nitride, such as titanium nitride (TiN), tantalum nitride (TaN), hafnium nitride (HfN), or the like, may be used as the electroconductive material.

The lower electrode 111 has light-shielding properties in the present embodiment. The term "light-shielding" as used here means that at least part of light is shielded, and is not restricted to cases where transmissivity of light is 0%, but rather means that transmissivity is lower than a predetermined value. The predetermined value is 10% for example, but is not restricted to this. Note that the lower electrode 111 may have translucency, and an electroconductive oxide such as indium tin oxide (ITO), zinc oxide (ZnO), or the like may be used to form the lower electrode 111.

The lower electrode 111 is formed by MOCVD, atomic layer deposition (ALD), sputtering, or the like, for example. The lower electrode 111 is formed by a thin film of electroconductive material being formed on top of the semiconductor substrate 120, for example. The thickness of the lower electrode 111 is 15 nm for example, but is not restricted to this.

The upper electrode 112 is an example of the second electrode of the capacitor 110. The upper electrode 112 is, out of the two electrodes that the capacitor 110 has, the electrode farther from the semiconductor substrate 120.

In the present embodiment, the upper electrode 112 covers a charge storage region 115. The charge storage region 115 is a portion that stores charge generated by the photodiode 410 that the lower electrode 111 is connected to. Specifically, the charge storage region 115 is the portion surrounded by dotted lines in FIG. 5, and includes the lower electrode 111, contact plug 140, and diffusion region 141.

The upper electrode 112 completely covers the lower electrode 111, for example. Specifically, the upper electrode 112 is formed extending further outwards than the edge portion at the top side of the lower electrode 111, as illustrated in FIG. 5. That is to say, the entire lower electrode 111 is situated on the inner side of the upper electrode 112 in plan view. Note that the dielectric layer 113 also completely covers the lower electrode 111, in the same way. Specifically, the dielectric layer 113 is formed extending further outwards than the edge portion at the top side of the lower electrode 111, and is provided above not only the lower electrode 111 but also the inter-layer insulating layer 131b, as illustrated in FIG. 5.

Due to the upper electrode 112 covering the charge storage region 115, change in potential of the charge storage region 115 can be suppressed even in a case where the potential of the wiring 132a changes, for example. Specifically, the upper electrode 112 functions as an electric shield with regard to the charge storage region 115, so the wiring 132a can be provided directly above the charge storage region 115. That is to say, the charge storage region 115 and the wiring 132a can be disposed overlaid in plan view, so the limited pixel area can be effectively used.

The upper electrode 112 is formed by MOCVD, ALD, sputtering, or the like, in the same way as the lower electrode 111. The upper electrode 112 is formed using the same material as the lower electrode 111, for example. Accordingly, the upper electrode 112 also has light-shielding properties. Note that the upper electrode 112 may be formed using a material different from the lower electrode 111. The upper electrode 112 may have translucency.

The dielectric layer 113 is formed using a so-called high-k dielectric material that has a higher permittivity than silicon dioxide ($SiO_2$). Specifically, the primary component of the dielectric layer 113 is a hafnium (Hf) oxide or zirconium (Zr) oxide. The dielectric layer 113 contains hafnium oxide or zirconium oxide of 50 mole percent or more. The dielectric layer 113 is formed by ALD, MOCVD, electron-beam (EB) vapor deposition, or the like.

The dielectric layer 113 is provided between the lower electrode 111 and upper electrode 112. Specifically, the dielectric layer 113 comes into contact with the upper face of the lower electrode 111 and the lower face of the upper electrode 112, and is formed having a generally uniform thickness. The thickness of the dielectric layer 113 is 10 nm or more, for example, and in one example is 20 nm, but is not restricted to this.

The capacitor 110 has a trench-shaped MIM structure in the present embodiment. The dielectric layer 113 of the capacitor 110 has a trench shape that is recessed in the direction from the upper electrode 112 toward the lower electrode 111, i.e., in the depth direction. That is to say, the dielectric layer 113 is three-dimensionally configured so that a trench 114 is formed on the upper face. The lower electrode 111, dielectric layer 113, and upper electrode 112 are each provided at a generally uniform thickness along the trench shape.

Note that the lower face of the lower electrode 111 may be formed flat, with the upper face following the trench shape. Also, the upper face of the upper electrode 112 may be formed flat, with the lower face following the trench shape.

Specifically, the capacitor 110 has four trenches 114, as illustrated in FIG. 3. The trenches 114 are grooves formed by the interface of the dielectric layer 113 and upper electrode 112, as illustrated in FIG. 5. Note that the four trenches 114 may be connected so as to form a single rectangular ring in plan view.

For example, the depth H of the trench 114 is greater than the width W of the capacitor 110. That is to say, the capacitor 110 is formed long in the depth direction, in cross-sectional view. For example, the depth H of the trench 114 is deeper than the distance between the wiring 132a and wiring 132b. Also for example, the depth H of the trench 114 may be deeper than the distance between the upper electrode 112 of the capacitor 110 and the wiring 132a. The depth H of the trench 114 is 400 nm is one example, but is not restricted to this.

Due to the capacitor 110 having the trenches 114, the capacity of the capacitor 110 can be increased while suppressing increase in the area in plan view. Accordingly, the saturation amount of the photodiode 410 can be increased, and an extended dynamic range can be realized.

On the other hand, the inter-layer insulating layer 131a is thick due to the capacitor 110 having the trenches 114. Accordingly, there is concern of oblique incident light entering an adjacent photodiode. That is to say, there is concern that crosstalk of light may occur. Particularly, the percentage of light entering obliquely is greater at unit cells 100 situated at the perimeter of the pixel portion 20 away from the middle thereof, so crosstalk of light readily occurs. Occurrence of crosstalk of light leads to increase or reduction in quantity of light, and in a case where a color filter of multiple colors is provided, mixture of color occurs.

Figure 6:
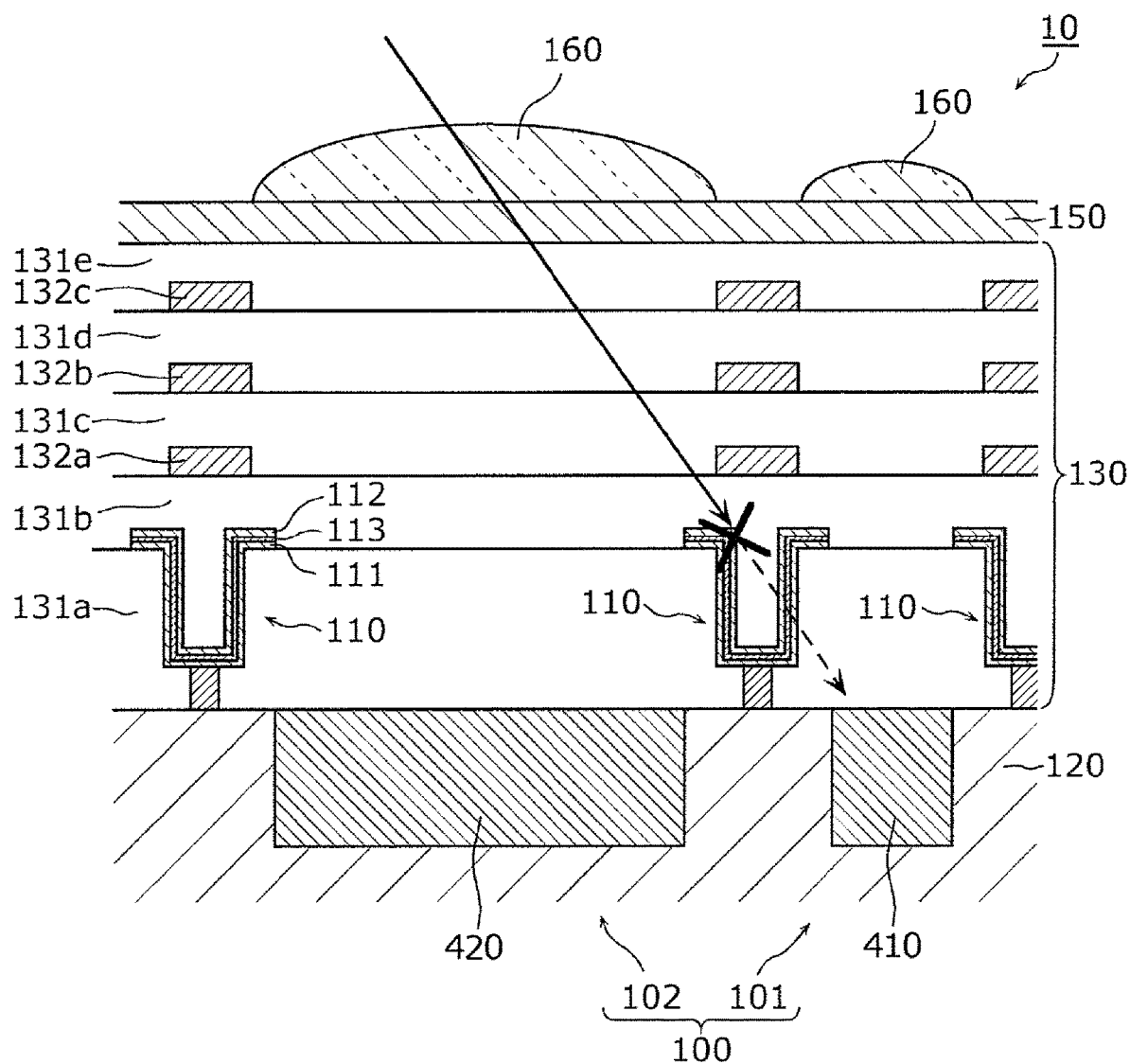
FIG. 6 is a cross-sectional view for describing the effects of a capacitor regarding oblique incident light in the imaging device according to the embodiment.

To counter this, at least one of the lower electrode 111 and upper electrode 112 of the capacitor 110 has light-shielding properties in the present embodiment, so obliquely entering light can be suppressed from entering an adjacent photodiode, as indicated by the solid arrow in FIG. 6. Thus, the crosstalk component of obliquely entering light can suppressed. FIG. 6 is a cross-sectional view for describing the effects of the capacitor 110 regarding oblique incident light.

As described above, according to the imaging device 10 of the present embodiment, the capacitor 110 is provided surrounding the photodiode 410, so lower noise can be realized. Also, the capacitor 110 is connected to the photodiode 410, so the saturation amount of signal charges generated at the photodiode 410 can be increased. Accordingly, the dynamic range can be expanded.

Also, the capacitor 110 is trench-shaped, so crosstalk of light can be suppressed. Accordingly, the quality of images generated by the imaging device 10 can be improved.

Modifications

Figure 7:
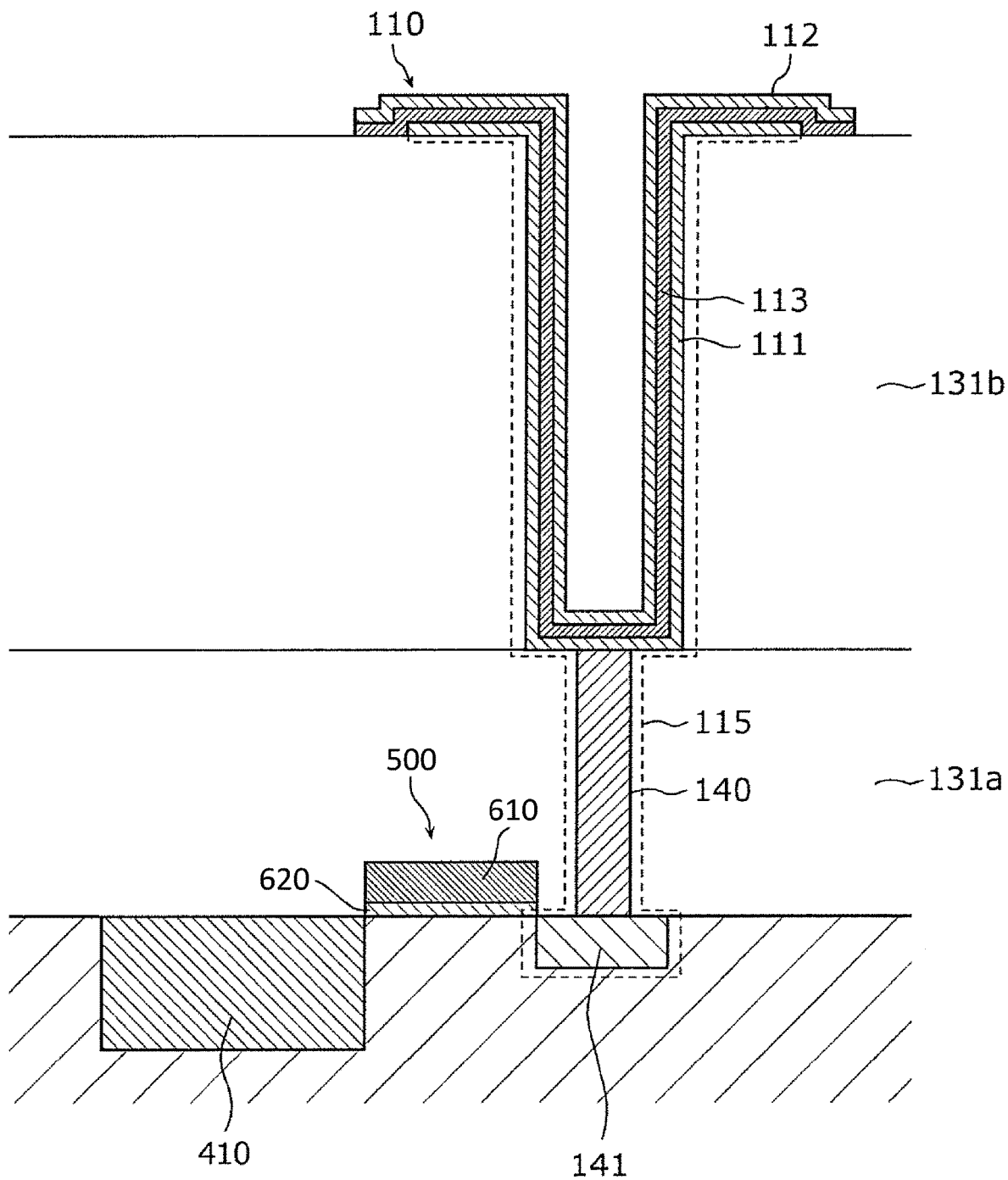
FIG. 7 is a cross-sectional view where a capacitor of an imaging device according to a first modification of the embodiment and the periphery thereof are enlarged in view.

A first modification of the embodiment will be described below with reference to FIG. 7. FIG. 7 is an enlarged view of principal portions, where the capacitor 110 of an imaging device according to a first modification and the periphery thereof are enlarged in view.

An example has been described in the embodiment above, where the lower electrode 111 that is the first electrode of the capacitor 110 and the photodiode 410 are directly connected, as illustrated in FIGS. 2 and 5. In the present modification, a transfer transistor 500 is provided between the lower electrode 111 and the photodiode 410, as illustrated in FIG. 7.

The transfer transistor 500 is a switching device for switching conduction/non-conduction between the photodiode 410 and the lower electrode 111 of the capacitor 110. One of the drain and source of the transfer transistor 500 is connected to the photodiode 410, and the other of the drain and source is connected to the lower electrode 111.

For example, one of the drain and source of the transfer transistor 500 is shared with the photodiode 410, as illustrated in FIG. 7. The other of the drain and source of the transfer transistor 500 is equivalent to the diffusion region 141, and is connected to the lower electrode 111 via the contact plug 140. A gate 610 of the transfer transistor 500 is provided on a gate insulating film 620 provided on the surface of the semiconductor substrate 120. The gate 610 is supplied with predetermined potential from the vertical scanning circuit 30, via a control line that is omitted from illustration. The conducting state and non-conducting state of the transfer transistor 500 is switched in accordance with the potential applied to the gate 610.

For example, the saturation amount of the charge can be made larger by the transfer transistor 500 going on and placing the photodiode 410 and capacitor 110 in a conducting state. Also, the saturation amount of the charge can be made smaller by the transfer transistor 500 going off and placing the photodiode 410 and capacitor 110 in a non-conducting state. Thus, the saturation amount of the charge can be switched by controlling the transfer transistor 500 going on and off, so the dynamic range of the imaging device 10 can be switched.

Note that in the present modification, the charge storage region 115 is equivalent to the lower electrode 111 of the capacitor 110, the contact plug 140, and the diffusion region 141. Accordingly, the upper electrode 112 of the capacitor 110 does not have to cover the gate 610 of the transfer transistor 500.

Other Embodiments

An imaging device according to one or multiple aspects has been described by way of an embodiment, but the present disclosure is not restricted to this embodiment. Various modifications of the present implementation that will be conceivable by one skilled in the art, and forms configured by combining components in different embodiments, without departing from the essence of the present disclosure, are also encompassed by the scope of the present disclosure.

Figure 8:
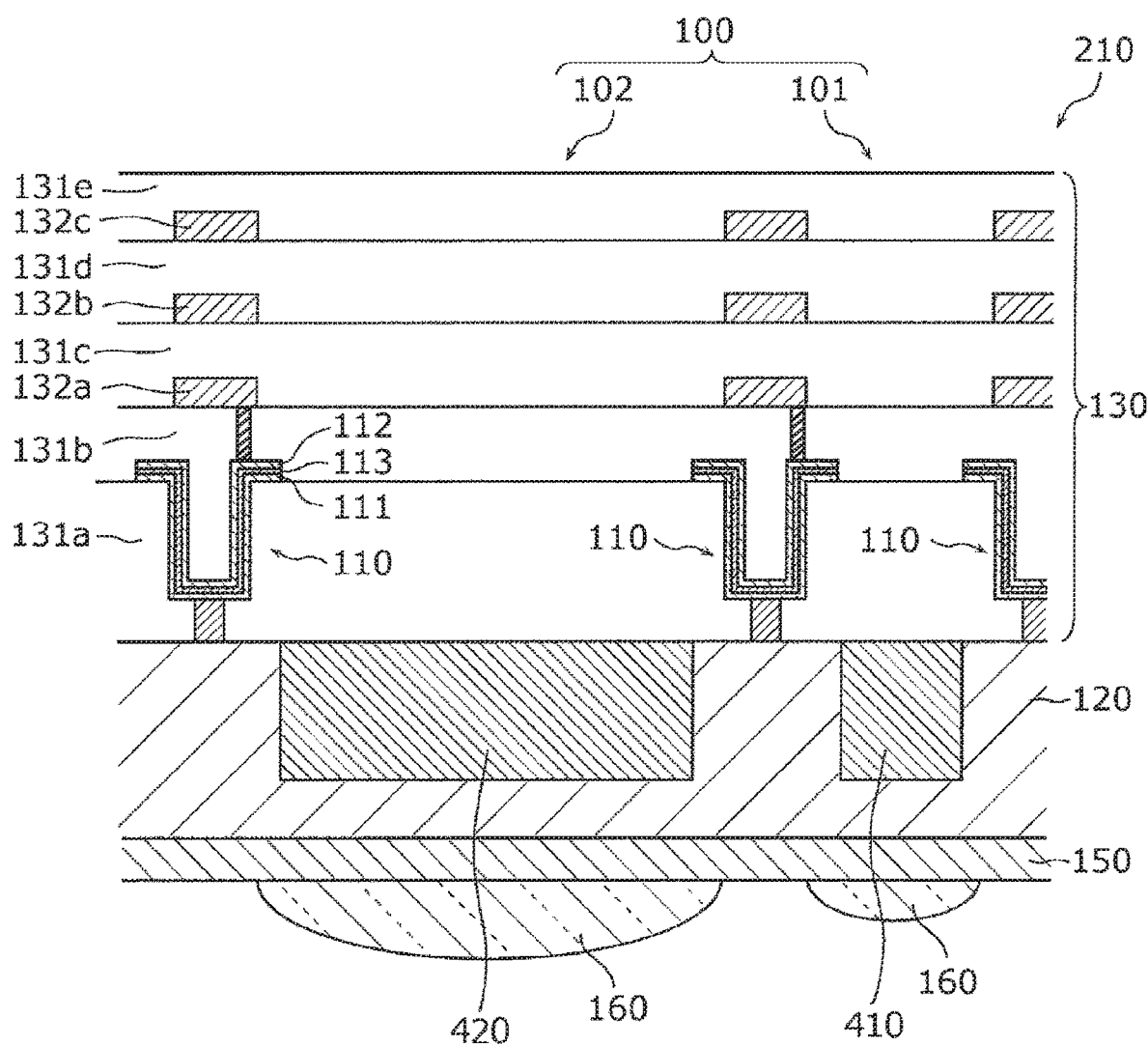
FIG. 8 is a cross-sectional view of a unit cell of an imaging device according to a second modification of the embodiment.

For example, the imaging device 10 has been described by way of an example of a front-illuminated imaging device in the above embodiment, but may be a back-illuminated imaging device. FIG. 8 is a cross-sectional view of the unit cells 100 of an imaging device 210 according to a second modification of the present embodiment. The imaging device 210 is the same in configuration as the imaging device 10 according to the embodiment, except for the point that the position where the planarization film 150 and microlenses 160 are disposed is different.

Specifically, the imaging device 210 has the planarization film 150 and microlenses 160 provided to the back face side of the semiconductor substrate 120, i.e., on the opposite side from the wiring layer 130, as illustrated in FIG. 8. Light from the back face side of the semiconductor substrate 120 enters the photodiodes 410 and 420 provided on the semiconductor substrate 120.

The photodiode 410 is connected to the capacitor 110 in the imaging device 210 according to the present modification in the same way as in the imaging device 10 according to the embodiment, so the dynamic range can be expanded. Also, the electrode of the capacitor 110 functions as an electric shield with regard to the photodiode 410, so change in potential of the photodiode 410 can be suppressed, and noise can be reduced.

Also, the capacitor 110 does not have to continuously encompass the entirety of the periphery of the photodiode 410 in plan view, for example. For example, the planar view shape of the capacitor 110 may be a C-shape or U-shape or the like, that is partly opened. Alternatively, the planar view shape of the capacitor 110 intermittent ring like a dashed line.

Further, the upper electrode 112 of the capacitor 110 does not have to cover the entirety of the charge storage region 115, for example. The lower electrode 111 of the capacitor 110 may be larger than the upper electrode 112, for example, and the upper electrode 112 may be situated within the lower electrode 111 in plan view. Also, the diffusion region 141 does not have to be covered by the upper electrode 112.

Also, the upper electrode 112 of the capacitor 110 may be connected to a photoelectric converter instead of the lower electrode 111, for example. That is to say, the upper electrode 112 may be an example of a first electrode connected to a photoelectric converter, and the lower electrode 111 may be an example of a second electrode.

Figure 9:
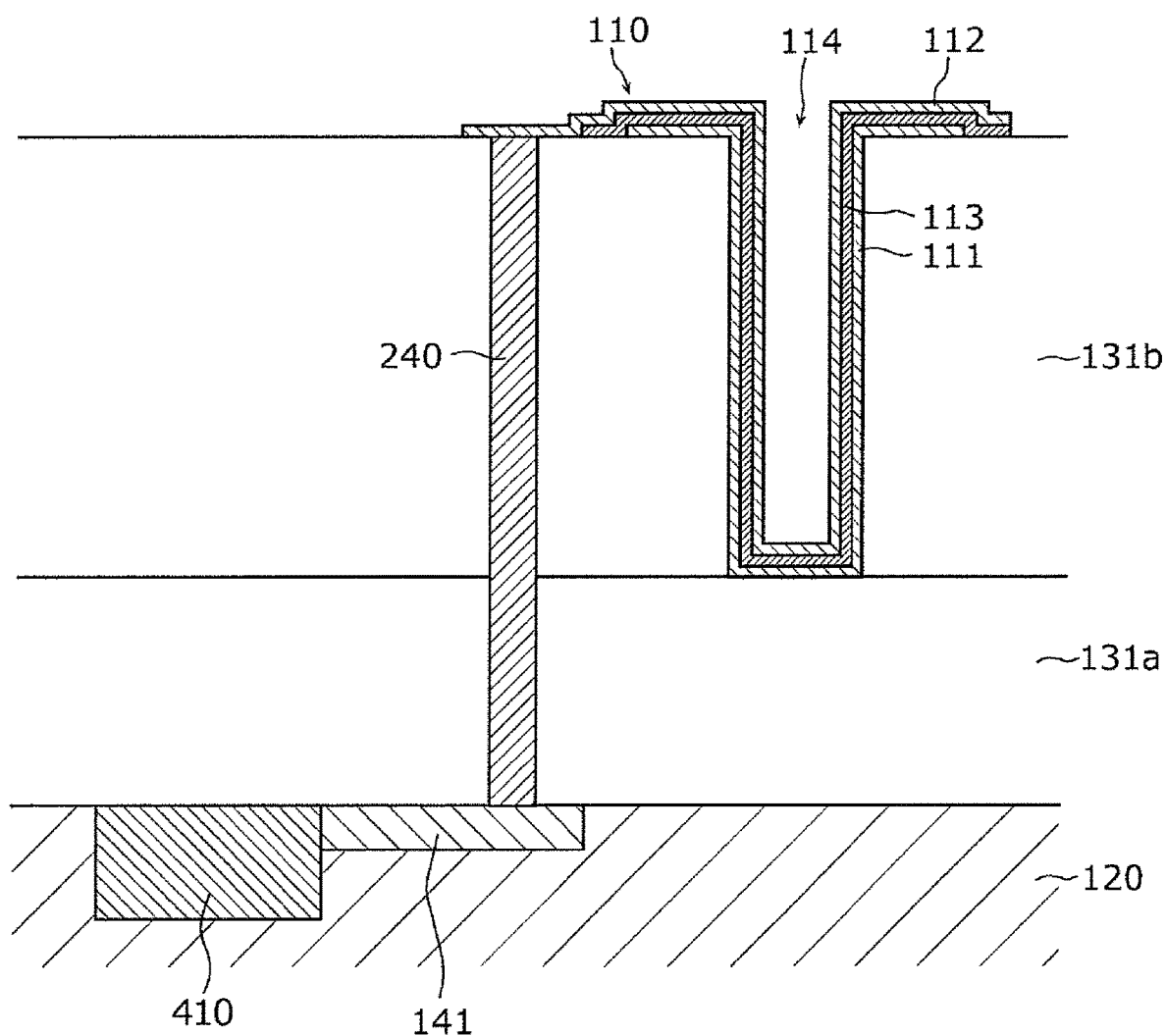
FIG. 9 is a cross-sectional view where a capacitor of an imaging device according to a third modification of the embodiment and the periphery thereof are enlarged in view.

FIG. 9 is an enlarged view of principal portions, where the capacitor 110 of an imaging device according to a third modification of the embodiment and the periphery thereof are enlarged in view. A contact plug 240 is provided instead of the contact plug 140 in the imaging device illustrated in FIG. 9. The upper electrode 112 is connected to the photodiode 410 via the contact plug 240 and the diffusion region 141. The dynamic range of the imaging device illustrated in FIG. 9 can also be expanded, since charges generated at the photodiode 410 can be stored in the capacitor 110.

Figure 10:
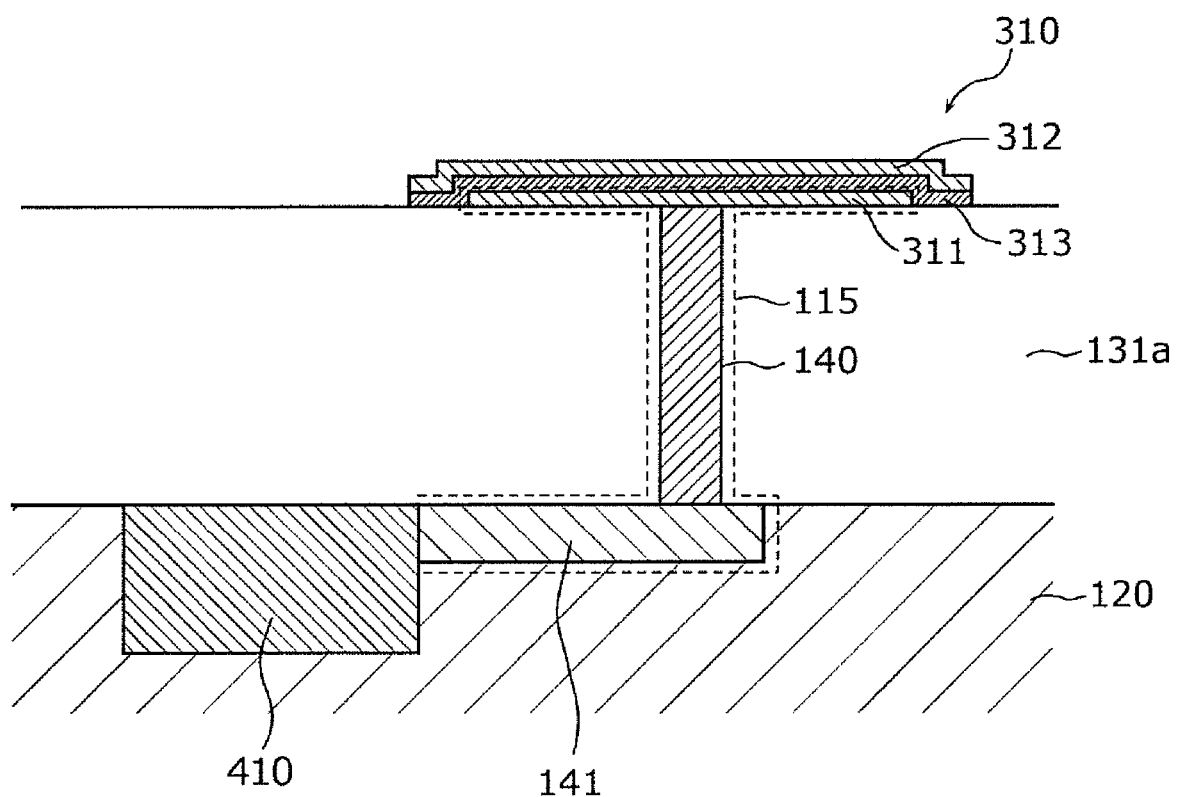
FIG. 10 is a cross-sectional view where a capacitor of an imaging device according to a fourth modification of the embodiment and the periphery thereof are enlarged in view.

Also, the imaging device 10 may have a capacitor with a parallel plate-shaped MIM structure instead of the capacitor 110, for example. FIG. 10 is an enlarged view of principal portions, where a capacitor 310 of an imaging device according to a fourth modification of the embodiment and the periphery thereof are enlarged in view.

As illustrated in FIG. 10, the capacitor 310 has a lower electrode 311, an upper electrode 312, and a dielectric layer 313 disposed between the lower electrode 311 and upper electrode 312. The lower electrode 311, upper electrode 312, and dielectric layer 313 each have a plate shape formed to a uniform film thickness. The functions, materials, method of formation, and so forth, of the lower electrode 311, upper electrode 312, and dielectric layer 313, are the same as with the lower electrode 111, upper electrode 112, and dielectric layer 113 according to the embodiment, except for the point that the shapes are different.

Also, the dielectric layer 113 of the capacitor 110 may be an insulating film such as a silicon oxide film or silicon nitride film or the like, for example, instated of a thin film using a high-k dielectric material.

Also, the lower electrode 111 of the capacitor 110 may be connected to the photodiode 420, for example. That is to say, the lower electrode 111 may be connected to the photoelectric converter of which the area in plan view is larger, out of the first photoelectric converter and second photoelectric converter that the imaging device 10 has.

Also, the capacitor 110 may encompass the photodiode 420 in plan view, with the lower electrode 111 remaining connected to the photodiode 410, for example. That is to say, the capacitor 110 may encompass a photodiode not directly electrically connected.

The unit cell 100 may also have two low-sensitivity pixels 101 and two high-sensitivity pixels 102. The two low-sensitivity pixels 101 are both connected to the first FD portion 106. The two high-sensitivity pixel 102 are both connected to the second FD portion 107.

The transfer transistors 510 of the two low-sensitivity pixels 101 may each be independent, for example, whereby the timing of reading out signal charges from each of the two low-sensitivity pixels 101 can be changed by switching the conducting state and non-conducting state. This is also true for the two high-sensitivity pixels 102 as well. Accordingly, the switch transistor 103, reset transistor 104, amplifying transistor 105, first FD portion 106, second FD portion 107, and so forth, can be shared among multiple pixels.

Also, a gray filter may be provided directly above the photodiode 410 of the low-sensitivity pixel 101 of the unit cell 100, for example, to reduce the quantity of incident light.

Also, the area of photodiodes may be uniform within the pixel portion 20, for example.

Also, the imaging device 10 may have phototransistors, organic photoelectric conversion films, or the like, as photoelectric converting units, instead of photodiodes, for example.

Various modifications, substitutions, additions, omissions, and so forth, may be made to the above-described embodiments, within the scope of the Claims or equivalency thereof.

What is claimed is:

1. An imaging device, comprising:
   a semiconductor substrate having a first principal surface, and a second principal surface on an opposite side of the first principal surface;
   a first photoelectric converter which is disposed in the semiconductor substrate and generates a first signal charge by converting first light incident to the first photoelectric converter;
   a second photoelectric converter different from the first photoelectric converter, which is disposed in the semiconductor substrate and generates a second signal charge by converting second light incident to the second photoelectric converter;
   at least two layers of wiring disposed above the first principal surface; and
   a capacitor which is disposed between the semiconductor substrate and the at least two layers of wiring and surrounds the first photoelectric converter in a plan view, wherein:
   the capacitor includes a first electrode, a second electrode, and a dielectric layer disposed between the first electrode and the second electrode, and the first electrode is connected to one of the first photoelectric converter and the second photoelectric converter.

2. The imaging device according to claim 1, further comprising:
   a charge storage region that stores a signal charge generated by the one of the first photoelectric converter and the second photoelectric converter, wherein:
   the first electrode is disposed between the semiconductor substrate and the second electrode, and
   the second electrode covers the charge storage region.

3. The imaging device according to claim 1, wherein:
   an area of the first photoelectric converter and an area of the second photoelectric converter differ from each other in a plan view, and
   the first electrode is connected to one of the first photoelectric converter and the second photoelectric converter having a smaller area than the other of the first photoelectric converter and the second photoelectric converter.

4. The imaging device according to claim 3, wherein the area of the first photoelectric converter is larger than the area of the second photoelectric converter.

5. The imaging device according to claim 1, wherein the semiconductor substrate is configured to cause the first light and the second light to enter the semiconductor substrate from the second principal surface.

6. The imaging device according to claim 1, further comprising:
   a wiring for applying a constant potential to the second electrode.

7. The imaging device according to claim 1, further comprising:
   a transistor,
   wherein the first electrode is connected to the one of the first photoelectric converter and the second photoelectric converter via the transistor.

8. The imaging device according to claim 1, wherein the second electrode continuously surrounds the first photoelectric converter.

9. The imaging device according to claim 1, wherein:
   the at least two layers of wiring include a first layer of wiring and a second layer of wiring, the second layer of wiring being closer to the semiconductor substrate than the first layer of wiring, and
   the capacitor is disposed in an inter-layer insulating layer which is closer to the semiconductor substrate than the second layer of wiring.

* * * * *